United States Patent [19]

Canty

[11] 4,141,736

[45] Feb. 27, 1979

[54] PHOTOSENSITIVE COMPOSITE SHEET MATERIAL CONTAINING POLY-2,5-OXOLANE

[75] Inventor: George Canty, Woodbury, Minn.

[73] Assignee: Minnesota Mining and Manufacturing Company, St. Paul, Minn.

[21] Appl. No.: 857,421

[22] Filed: Dec. 5, 1977

Related U.S. Application Data

[63] Continuation of Ser. No. 742,879, Nov. 18, 1976, abandoned.

[51] Int. Cl.$^2$ .............................................. G03C 1/68
[52] U.S. Cl. ........................................ 96/87 R; 96/33; 96/35.1; 96/115 P; 204/159.11; 204/159.14; 204/159.23; 428/411; 428/412; 428/413; 428/480; 428/483; 428/500; 428/913

[58] Field of Search ............... 428/411, 412, 413, 480, 428/483, 500, 913; 260/347.5; 526/57; 96/87 R, 33, 35.1, 115 P; 204/157.11, 159.14, 159.23, 157.1 R; 427/53, 302, 407

[56] References Cited

U.S. PATENT DOCUMENTS

| | | | |
|---|---|---|---|
| 3,767,523 | 10/1973 | Schwarz | 428/520 |
| 3,948,666 | 4/1976 | Kitanishi | 96/115 P |
| 4,001,015 | 1/1977 | Barzynski | 96/115 P |
| 4,001,016 | 1/1977 | Rosenkranz | 96/115 P |

*Primary Examiner*—Marion E. McCamish
*Attorney, Agent, or Firm*—Cruzan Alexander; Donald M. Sell; James V. Lilly

[57] ABSTRACT

A photosensitive composite sheet material comprising (i) a dimensionally stable substrate, (ii) a water-insoluble coating thereon of a poly-2,5-oxolane homopolymer or copolymer, the copolymer containing repeating units formed from epoxidized dienes and/or anionically polymerizable olefins, and (iii) a layer of photopolymerizable composition on the water-insoluble coating.

8 Claims, No Drawings

PHOTOSENSITIVE COMPOSITE SHEET MATERIAL CONTAINING POLY-2,5-OXOLANE

This is a continuation of application Ser. No. 742,879 filed Nov. 18, 1976, now abandoned.

FIELD OF THE INVENTION

This invention relates to the art of photosensitive composite sheet materials. More particularly it relates to photosensitive sheet materials which are useful as printing plates.

DESCRIPTION OF THE PRIOR ART

It is well known in the printing art to coat substrates with a photosensitive composition. The resultant photosensitive surface can then be used as such, or it can be protectively coated with a lacquer or resin layer, to increase its resistance to abrasion, handling, smudging, etc. In any event, when the photosensitive plate is exposed to a suitable actinic light source through a transparency (e.g., a negative) or other means for selective transmission of such light, image and non-image areas are formed. Subsequently, the plate is developed to provide printing and non-printing areas. The resultant plates may then be used, for example, in letterpress, offset, flexographic and lithographic printing processes.

Often the photopolymerizable compositions used with such plates are 100% solids materials which are fluid prior to exposure to actinic light, but which polymerize and harden after exposure to light. The polymerized products are not affected during development while the nonpolymerized composition is removed during development.

A major drawback of printing plates of this type is their relatively short press life due to the lack of good adhesion of the photopolymerized material to the substrate. While the polymerized material exhibits some adhesion to the substrate, it also exhibits an undesirable tendency to be removed from the substrate during the printing process. This may be caused by the rigors of the process itself or undercutting of the polymerized material by the developer. Whatever the cause, the net effect is to require that a duplicate plate be prepared.

The present invention overcomes these disadvantages by providing a photosensitive composite sheet material having a thin coating of a primer layer between the substrate and the photopolymerizable composition. After irradiation by a suitable light source the primer layer firmly anchors the photopolymerized composition to the substrate and prevents its removal from the plate during printing processes. Consequently, the resulting plates may be used for many thousands (e.g., over 100,000) of impressions.

SUMMARY OF THE INVENTION

In accordance with the present invention there is provided a composite sheet material comprising:
(i) a dimensionally stable substrate;
(ii) a water-insoluble, organic polymeric coating on at least one surface of said substrate, said coating consisting essentially of
(a) from about 10 to 100 mole percent of blocks of units of the formula

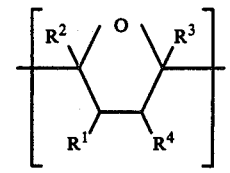

(b) from about 0 to 90 mole percent of blocks of units of the formula

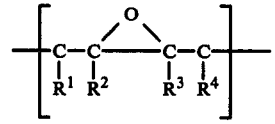

and
(c) from about 0 to 75 mole percent of blocks of units of the formula

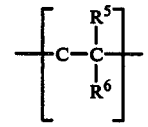

wherein $R^1$, $R^2$, $R^3$ and $R^4$ are individually hydrogen or alkyl groups containing up to 8 carbon atoms each, $R^5$ is hydrogen or methyl and $R^6$ is phenyl, cyano or —$COOCH_3$; and
(iii) a layer of a photopolymerizable composition comprising a free-radical initiated, addition polymerizable compound and a photopolymerization initiator.

The water-insoluble coating acts as an adhesion-promoting layer and thereby enhances the degree of adhesion of the photopolymerizable composition to the substrate. For purposes of convenience the water-insoluble polymer is sometimes referred to hereinafter as poly-2,5-oxolane. It may also be referred to as poly-2,5-oxolanylene.

DETAILED DESCRIPTION OF THE INVENTION

The photosensitive composite materials of the present invention may be conveniently prepared by, for example, applying a thin layer of poly-2,5-oxolane to at least one surface of the dimensionally stable substrate. Typically this is accomplished by applying a solvent solution of the polymer and then removing the solvent by, for example, heating the coated substrate to 75° C. A layer of a photopolymerizable composition may then be applied to the adhesion-promoting layer. This may be accomplished by conventional coating techniques (e.g., roll coating, knife coating, etc.). The resultant composite is then ready to be imaged and developed. A variety of techniques may be used to photopolymerize the photosensitive material of sheets of the invention. For example the sheets may be irradiated with actinic (ultraviolet) light for a time sufficient to cause the composition to polymerize. The amount of irradiation may be varied by changing the intensity of the light used and/or the length of time of exposure. Moreover, it may be desirable to irradiate one side of the sheets of the invention in an image-wise manner for a relatively long period of time (e.g., 5 minutes or more) and then irradiate the other side of the sheets in an overall manner for a relatively short period of time (e.g., 1 minute or less). The first irradiation creates a hardened polymeric material from the top to the bottom of the photopolymerizable layer in imaged areas. The second irradiation creates a thinner base layer of hardened polymeric material at the bottom of the photopolymerizable layer.

A variety of techniques may be used to develop the imaged plates. They include, for example, rubbing, spraying, washing, etc. Typically the plates are developed by spraying or washing with a solution of, for example, a mild detergent, water, solvent, etc.

A variety of useful dimensionally stable substrates are known. They may be either transparent or opaque to actinic light although it is generally preferred that they be transparent. The thickness of the substrate is not critical to the present invention, although it is preferably in the range of about 0.025 millimeters (mm) to 0.15 mm.

Organic polymeric materials are especially useful as the substrate. Representative examples of such substrates are films of saturated polyesters, polyolefin, polycarbonate, polyamide, polyvinyl chloride, polyvinilidene chloride, polyacrylate, and cellulose ester.

A preferred class of organic polymeric substrates are the saturated polyesters (e.g., polyethylene terephthalate, polycylohexane dimethyl terephthalate and polyethylene naphthalate). Typically these polyesters are biaxially oriented and heat set crystalline thermoplastic materials which have a high degree of dimensional stability.

A particularly preferred sub-class of polyesters are those composite films which comprise two distinct but firmly united coextruded layers. Coextrusion is a process in which a composite film having constituent layers of thermoplastic material is formed. See, for example, U.S. Pat. No. 3,767,523. The process involves simultaneously extruding the constituent layers of the composite film through a die so that the layers meet under laminar flow conditions, intermingle at the interface and become firmly united. It is highly preferred that the coextruded films be biaxially oriented and heat-set.

The first, or base, layer of the coextended film is preferably polythylene terephthalate. However, other polyesters, such as polycyclohexane dimethyl terephthalate and polyethylene naphthalate, may make up the first layer. In any event the first layer may be prepared from the reaction of the appropriate dicarboxylic acid with ethylene glycol. Alternatively the acid may be converted to the ester which is allowed to react with the glycol by ester interchange. Generally, equimolar amounts of the glycol and acid are reacted. Minor amounts (e.g., up to 10 mole percent) of other dicarboxylic acids such as isophthalic, phthalic, 2,5- or 2,7-naphthalate dicarboxylic, succinic, sebacic, adipic, azelaic, suberic, pimelic, glutaric, etc., or a diester thereof, may be substituted for the acid without deleteriously affecting the properties of the resultant film. Additionally minor amounts (e.g., up to 10 mole percent) of other glycols such as 1,3-propane diol, 1,4-butane diol, etc. may be substituted for the ethylene glycol.

The second, or top, layer of the coextruded film is a polyester which melts below 230° C., does not crystallize rapidly, and is substantially noncrystalline between about 20° and 230° C. (e.g., not more than a minor amount of crystallinity between said temperatures).

Polyesters of this type may be produced by the condensation reaction of (i) a dicarboxylic acid component consisting of from about 10 to 100 mole percent of a dicarboxylic acid (e.g., isophthalic, hexahydroterphthalic, sebacic, succinic, adipic, etc.) or mixtures thereof, or the diesters of such acids and, correspondingly, from about 90 to 0 mole percent of terephthalic acid, and (ii) a glycol component in substantially equimolar proportions with the dicarboxylic acid component. Preferably the glycol is a polymethylene glycol having the formula HO(CH$_2$)$_n$OH, wherein $n$ is an integer of 2-10. Such glycols include ethylene glycol, 1,3-propane diol and 1,4-butane diol. Other useful glycols include neopentyl glycol, 1,4-cyclohexane dimethanol and aromatic hydroxylic such as bisphenol A.

As previously stated, the substrate is formed by a coextrusion process, wherein the individual layers meet under laminar flow conditions and are expelled from the die as an integral, multi-layer film structure. Coextruded films prepared in this manner look much like monolayer films. Such coextrusion processes are well known as exemplified by aforementioned U.S. Pat. No. 3,767,523 and by U.S. Pat. No. 3,486,196 and No. 3,476,627.

The freshly coextruded support film, formed as described above, is amorphous. It is thereafter endowed with improved physical properties by biaxial orientation and heat-setting. Biaxial orientation involves stretching the film in two directions, each normal to the other. Generally the film is stretched in the machine direction and at right angles thereto. In a typical operation, the freshly extruded molten film is fed onto a cooling drum to produce a quenched amorphous film which is briefly heated and stretched in the machine direction, and then conducted through a tenter frame where it is stretched transversely with moderate heating. Machine direction stretching may be accomplished by passing between two sets of nip rolls, the second set rotating at a higher speed than the first. Tentering of plastic films or sheet material is illustrated in U.S. Pat. No. 2,823,421.

Heat-setting, or heat-stabilization of the stretched coextruded film is accomplished by restraining the film in its stretched dimension and heating briefly, then quenching. Such heating is typically in the range of 175° C.–230° C.

The coextruded biaxially oriented film should have a total thickness of at least 0.025 mm with at least 1/4 this thickness being the second polyester layer. Preferably the second polyester layer should not be thicker than 0.025 mm even for very thick films.

Water-insoluble coatings useful as the priming layer in the present invention may be generally described as poly-2,5-oxolane homopolymers and copolymers. These polymers, consist essentially of (a) from about 10 to 100 mole percent of blocks of units of the formula

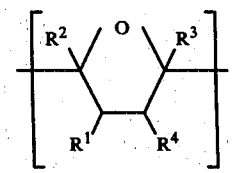

(b) from about 0 to 90 mole percent of blocks of units of the formula

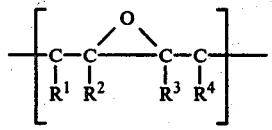

and (c) from about 0 to 75 mole percent of blocks of units of the formula

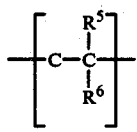

wherein $R^1$ through $R^6$ are as described above.

The oxolane rings in the (a) units are saturated and the hydrogen atoms thereon (one each on the 3 and 4 carbon atoms of the ring) as well as those required in the (b) and (c) units are omitted in order to simplify and clarify the formulae. As it is used throughout the specification, the term "blocks" means a plurality (e.g. 2 or more) of identical units attached one to the other.

The preferred homopolymeric-2,5-oxolanes (100 mole percent of (a) units and zero mole percent of (b) and (c) units) are those in which $R^1$, $R^2$, $R^3$ and $R^4$ are all hydrogen or in which $R^1$, $R^2$ and $R^4$ are hydrogen and $R^3$ is an alkyl radical, most preferably methyl. The preferred copolymeric-2,5-oxolanes contain zero mole percent of (c) units. In such copolymers $R^1$, $R^2$, $R^3$ and $R^4$ are preferably hydrogen.

A preferred subclass of the copolymers are those consisting essentially of blocks of from about 25 to 100 mole percent of (a) units, blocks of from about 0 to 75 mole percent of (b) units and no (c) units. Again in this subclass, $R^1$, $R^2$, $R^3$ and $R^4$ are each most preferably hydrogen.

Other groups may be randomly incorporated throughout the polymer chain. Such groups include, for example, olefins, hydroxyls, carbonyls, etc. It does not appear that such groups affect the properties of the polymers. Normally they do not make up more than 5 mole percent of the polymers, although in some cases they may be up to 15 mole percent of the polymers.

The polymers may be conveniently prepared from preformed diene polymers. These precursor polymers may be homopolymers (e.g., polybutadiene, polyisoprene, etc.) or copolymers. The copolymers may contain only diene units or they may also contain blocks of units resulting from anionically polymerizable olefin (particularly styrene, acrylonitrile and methylmethacrylate units). Examples of commercially available polymers of this type are "Kraton 1101" (29 weight percent polystyrene, 0.94 specific gravity, principal glass transition temperature of about −90° C.) and "Kraton 1107" (14 weight percent polystyrene, 0.93 specific gravity, principal glass transition temperature of about −60° C.). These polymers, available from Shell Chemical Co., are block copolymers of the A-B-A type. In "Kraton 1101" the A units are polystyrene and the B units are polybutadiene. In "Kraton 1107" the A units are polystyrene and the B units are polyisoprene.

In any event the polydienes are derived from the 1,4-polymerization of the diene precursor. The resultant polydiene preferably shows less than 10 percent 1,2- or 3,4-diene addition products since such products interfere with subsequent oxolane formation. The 1,2- and 3,4-diene addition may be surpressed by anionically polymerizing the diene in a non-polar solvent (e.g., cyclohexane). The diene units of the precursor polymers are substantially epoxidized (e.g., 90 mole percent of the diene linkages are converted to oxirane groups) then partially or completely converted to oxolane units to form the poly-2,5-oxolanes. During these reactions the olefin units remain unchanged.

The molecular weight, configurations and end groups of the poly-2,5-oxolanes are determined by the precursor diene polymer. Ordinarily, precursors (and the polyoxolanes prepaed from them) are linear and have a degree of polymerization of at least about 100. Thus the sum of the numbers of (a), (b) and (c) units in the poly-2,5-oxolanes is at least about 100. A polymer prepared from a polydiene with a degree of polymerization of 100 would have a molecular weight of approximately 7,000. More typically the precursor polyoxolanes have molecular weights in the range of from about 50,000 to 200,000 (degrees of polymerization of about 1,000–4,000, although they may run as high as about 1,000,000 (degrees of polymerization of about 20,000).

The end groups of the polyoxolanes depend upon the end groups of the precursor diene polymers themselves and upon the particular catalysts and termination conditions used. Ordinarily the end groups will be simply a monomer unit of type (a), (b) or (c) end capped with a saturated hydrocarbon group (e.g., methyl or butyl). At any rate, the end groups make up not more than two percent of the weight of the polyoxolanes.

The amount of poly-2,5-oxolane applied to the substrate may be varied over rather wide limits. The exact amount used is affected by the type of photosensitive composition being applied and the type of printing process to be employed. Preferably the dried coating weight of the poly-2,5-oxolane on the substrate is at least about 0.005 milligram per square centimeter ($mg/cm^2$).

Photopolymerizable compositions useful in the present invention are known to the art. Typically they comprise one or more free-radical initiated, addition polymerization compounds and one or more photopolymerization initiators.

Preferably the photopolymerizable composition contains at least one component which contains ethylenic unsaturation. Such materials include alkylene or polyalkylene glycol diacrylates, e.g., ethylene glycol diacrylate, diethyleneglycol diacrylate, glycerol diacrylate, glycerol triacrylate, ethylene glycol dimethyacrylate, 1,3-propanediol dimethacrylate. 1,3-propanediol dimethacrylate, 1,2,4-butanetriol trimethacrylate, 1,4-cyclohexanediol diacrylate, pentaerythritol tetramethacrylate, pentaerythritol triacrylate, sorbitol hexacrylate; bis[1-(3-acryloxy-2-hydroxy)]-p-propoxyphenyl dimethylmethane, bis[1-(2-acryloxy)]-p-ethoxyphenyl-dimethylmethane, trishydroxethylisocyanurate trimethacrylate, the bisacrylates and bismethacrylates of polyethylene glycols of molecular weight 200–500 and the like, unsaturated amides, e.g., methylene bis-acrylamide, methylene bismethacrylamide, 1,6-hexamethylene bisacrylamide, diethylene triamine trisacrylamide, β-methacrylaminoethyl methacrylate; vinyl esters such as divinyl phthalate. Other useful components which contain ethylenic saturation include alkyl esters of acrylic acid and methacrylic acid including such esters as methyl acrylate, methyl methacrylate, ethyl acrylate, isopropyl methacrylate, n-hexyl acrylate, stearyl acrylate, allylacrylate, styrene, diallyl phthalate and the like.

Still other useful materials include unsaturated polyesters such as described in U.S. Pat. Nos. 3,960,572 and 3,628,963.

Photopolymerization initiators useful in the photosensitive layer include any of the known photoinitiators. For example benzoin alkylate compounds (e.g., methyl, ethyl, isopropyl, octyl, vinyl and allyl ethers of benzoin) are useful. Other useful initiators include anthraquinones (e.g., anthraquinone, chloroanthraquinone, methylanthraquinone, ethylantraquinone, tertiary butylanthraquinone); diketones (e.g., benzil, diactyl); aromatic ketones (e.g., acetophenone, benzophenone, Ω-bromoacetophenone); disulfides (e.g., diphenyl disulfide and tetraethylthiuram disulfide). Other useful initiators include the chromophore-substituted vinyl-halomethyl-s-triazine compounds described in U.S. Pat. No. 3,954,475.

Other ingredients may be included in the photopolymerizable compositions. For example block copolymers of the A-B-A type (described as monovinylarene-diene-monovinylarene types in British Pat. No. 1,395,822) are useful. The A blocks of such polymers have a glassy character while the B blocks are elastomeric. Other useful ingredients include organic resins (e.g., polyvinyl acetates) fillers, colorants.

Photopolymerizable compositions of the type set forth above are known to the art. Moreover a number of such compositions are described in British Pat. No. 1,395,822; and U.S. Pat. Nos. 2,760,863; 3,801,328; 3,858,510; 3,661,744; 3,615,450; 3,960,572; 3,628,963. Still other photopolymerizable compositions of the type described are known and are included within the scope of the disclosure and claims.

The thickness of the photopolymerizable layer is not critical to the present invention. Thus it may be varied over a relatively wide range. For example a comparatively thin layer of photopolymer (e.g., .05 mm) is useful for some applications while thicker layers (e.g., 0.2 mm or more) are useful for other applications.

The present invention is further illustrated in the following examples. In these examples the preparation of the poly-2,5-oxolane primers and the photosensitive compositions is described in sections A and B respectively. The adhesion of the polymerized compositions to the substrate was determined by peel tests in which 90° and 180° peel adhesion values were determined. The 90° peel was determined according to ASTM test method D-1876-69. The 180° peel was determined according to ASTM test method D-903-49 (Reapproved 1965). In each test the procedure was modified so that the test specimens were 2.5 cm wide by 15 cm long. An Instron tester operating at a jaw speed of 12.5 cm/min. was used.

The preparation of the primer compositions and the photopolymerizable compositions used throughout the examples are set forth below.

A. Preparation of Poly-2,5-Oxolane Primer Compositions Method I

A block copolymer consisting essentially of blocks of repeating oxolane units

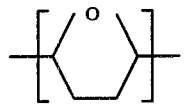

and blocks of the repeating oxirane units

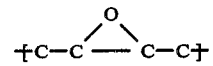

was prepared. A first solution consisting of 60 grams cis-1,4-polybutadiene and 1200 grams methylene chloride was prepared. A second solution consisting of 246 grams of 40% peracetic acid, 13% water, 5% hydrogen peroxide and 2% sulfuric acid, 40% acetic acid, and 17 grams of sodium acetate was slowly added to the first solution. The resultant mixture was allowed to react at or below room temperature (25° C.) for about 12 hours under a nitrogen atmosphere. The reaction temperature was maintained at or below room temperature by means of a dry ice/acetone bath. The resultant product, epoxidized cis-1,4-polybutadiene, was washed with successive portions of water (2 liters), water/sodium carbonate (2 liters/40 grams) and water (2 liters) and then precipitated with 1 liter of methanol and then collected. The polymer was then redissolved in 1480 grams of dioxane and some of the residual methylene chloride removed by heating the solution to a reflux temperature of 72° C.

The epoxidized cis-1,4-polybutadiene was cyclized by adding 43 grams of tetramethyl ammonium hydroxide solution (20% by weight in methanol) and 100 milliliters of water to the purified solution. The mixture was reacted at 70° C. with agitation. Separate 50 ml samples of the reaction mixture were taken after 2 and 17 hours. The samples were precipitated into water and the precipitate and redissolved in dioxane. A portion of the polymer was reprecipitated and then dissolved in chloroform. This solution was used to analyze the polymer by proton nuclear magnetic resonance. The samples were run in chloroform using tetramethylsilane as a reference. The results are given below in Table 1.

TABLE 1

| Time (Hours) | Mole % Polyoxirane | Mole % Polyoxolane |
|---|---|---|
| 2 | 62 | 38 |
| 17 | 34 | 66 |

For purposes of convenience, these primer compositions will be referred to hereinafter as primer compositions IA and IB respectively.

Method II

A block copolymer consisting essentially of blocks of repeating oxolane unit

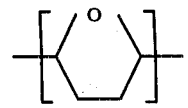

and blocks of repeating oxirane unit

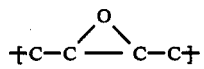

was prepared. A first solution consisting of 150 grams cis-1,4-polybutadiene and 3000 ml methylene chloride was prepared. A second solution consisting of 530 grams of 40% per acetic acid, 13% water, 5% hydrogen peroxide and 2% sulfuric acid, 40% acetic acid, and 36.8 grams sodium acetate was slowly aded to the first solution. The resultant mixture was allowed to react at or below room temperature for about 3½ hours under a nitrogen atmosphere. The reaction temperature was maintained at or below room temperature by means of a dry ice/acetone bath. The resultant product, epoxidized cis-1,4-polybutadiene, was precipitated into 4 gallons of methyl alcohol. The solid polymer was recovered and redissolved in p-dioxane. This solution was then precipitated in distilled water. The polymer was then dried in a desiccator, using $P_2O_5$ as a desiccant. A vacuum pump was used to reduce the pressure to 1 Torr.

The epoxidized polybutadiene (71 grams) was then cyclized. It was dissolved in 1275 grams dioxane to which 85.2 grams water had been added. This solution was heated until a reflux temperature of 75° C. had been obtained. At this point 106.5 grams of tetrabutylammoniumhydroxide solution (25% by weight in methanol) was added. The mixture was reacted at reflux under a nitrogen atmosphere for 28 hours. The resultant cyclized polymer was recovered by precipitating it into 3 liters of distilled water. The precipitated polymer was then placed into 2 liters of toluene and the water was removed by azeotropic distillation. The resultant polymer solution was then filtered through a 25 micron fritted glass filter. The resultant polymer was analyzed by proton nuclear magnetic resonance. Samples were run in chloroform using tetramethylsilane as a reference. The polymer was found to contain 86 mole percent polyoxolane units, 9 mole percent polyoxirane units and 5 mole percent polyolefin units. For purposes of convenience this primer composition will be referred to hereinafter as primer composition II.

B. Preparation of Photopolymerizable Compositions:

I. Compositions A-F

Compositions A and B were prepared by mixing all of the ingredients, with the exception of the photoinitiator, at room temperature (25° C.) until a solution was obtained. The photoinitiator was then added and dissolved in the solutions under safe-light conditions. Compositions C-F were prepared by mixing the ingredients at 60°–70° C. until a solution was obtained. The exact formulae of compositions A-F were as follows:

| | | |
|---|---|---|
| A. | "Kraton 1102" (A block copolymer of the A-B-A type wherein A is polystyrene and B is polybutadiene; having a $M_n$ of about 56,500 and a polystyrene content of about 30% by weight; commercially available from Shell Chemical Co.) | 50g |
| | Trimethylolpropane triacrylate, | 10g |
| | Toluene | 150g |
| | Benzophenone | 1g |
| B. | "Corezyn 3" (An unsaturated polyester commercially available from Commercial Resins Corp, which comprises the condensation product of 2 moles | |

| | | |
|---|---|---|
| | adipic acid, 1 mole maleic anhydride and 1 mole phthalic anhydride with 2.4 moles diethylene glycol and 1.6 moles propylene glycol | 50g |
| | N-3-oxo-1,1-dimethylbutyl acrylamide | 7.5g |
| | Diethylene glycol dimethacrylate | 52.5g |
| | Benzoin ethyl ether | 1g |
| C. | "Corezyn 3" | 38g |
| | Acrylic Acid | 7.2g |
| | Benzoin Butyl Ether (BBE) | 1g |
| D. | "Corezyn 3" | 38g |
| | Polyethylene glycol dimethacrylate | 29g |
| | BBE | 1.5g |
| E. | "Corezyn 3" | 58g |
| | Isooctylacrylate | 16g |
| | Acrylic acid | 7g |
| | BBE | 1g |
| F. | "Corezyn 3" | 38g |
| | Hydroxyethyl acrylate | 11.6g |
| | BBE | 1g |

II. Composition G

A photopolymerizable composition employing an vinyl-terminated urethane prepolymer was prepared. The prepolymer was made by mixing 200g polypropylene glycol (Mw = 2000, commercially available from Union Carbide), 11.6g allyl alcohol, 0.4g dibutyl tin dilaurate and adding the mixture to 34.8g tolylene diisocyanate. The rate of addition was adjusted to maintain the temperature at about 55° C. A nitrogen atmosphere was maintained over the vessel at all times. Addition required about 20 minutes. The mixture was allowed to cool and stand overnight and then reheated to 60° C. for 2 hours to remove unreacted allyl alcohol.

Twelve grams of the prepolymer and 0.24g of benzophenone were mixed until a solution was obtained. The solution was then mixed with 3.28g pentaerythritoltetrakis-($\beta$-mercaptopropionate) to form the photopolymerizable composition (sometimes referred to hereinafter as photopolymerizable composition G).

III. Composition H

A photopolymerizable composition employing a water-soluble photosensitive resin composition was prepared. The photosensitive composition was made by adding 60 grams of polyvinyl alcohol and 85 grams of water to a flask. The resulting mixture was heated at 95° C. with agitation for 3 hours. A second mixture comprising 60 grams $\beta$-hydroxyethylmethacrylate (containing 0.1 percent by weight hydroquinone), 0.6 grams polyethylene dimethacrylate and 1.8 grams benzoin ethyl ether was prepared and added to the solution over a 30 minute period. The resultant mixture was heated at 60° C. for 1.5 hours. An additional 55 grams of water was added to the flask at this point and the final mixture agitated until a uniform composition was obtained.

C. The Examples

EXAMPLE 1

Separate photosensitive plates were prepared using photopolymerizable compositions A-H. The substrate employed in each plate comprised a biaxially oriented and heat set coextruded film consisting of a first layer (0.0875 millimeter (mm) thick) of polyethylene terephthalate and a second layer (0.0125 mm thick) of the condensation reaction product of 80 mole percent isophthalic acid and 20 mole percent terephthalic acid with an equimolar quantity (based upon the quantity of the dicarboxylic acids) of polyethylene glycol. Primer composition IB at a dried coating weight of 0.2 milligrams per square centimeter (mg/cm$^2$) was used on each plate. The primer was applied to the second polyester layer of the substrate from a dioxane/methanol solution thereof and dried at 50° C. for 2 minutes. Each photopolymerizable composition was applied to the dried primer to a thickness of 0.05 mm.

A thin sheet of clear polypropylene was placed over the photopolymerizable layers and a negative transparency was placed over that. The front side (e.g., transparency side) of the resulting structures was irradiated with 1 milliwatt per square centimeter (mw/cm$^2$) of ultraviolet light for five minutes. The back side of the structures was irradiated with 1 mw/cm$^2$ of ultraviolet light for 1 minute. A General Electric G8T5 black lamp was used to irradiate the plates employing compositions A–F and H. A General Electric Sun Lamp (model RS, 275 watt, 110–125 volt A.C.) was used to irradiate the plate employing composition G. The transparencies and polypropylene sheets were then removed and the plates washed to remove the photopolymerizable composition from non-irradiated areas. The resulting imated plates produced high quality copies when used in flexographic printing processes.

EXAMPLE 2

Example 1 was repeated using photopolymerizable composition D and various amounts of poly-2,5-oxolane primer composition IB. The resulting imaged plates produced high quality copies when used in flexographic printing processes. The dried primer coating weights employed were:
0.3 mg/cm$^2$
0.15 mg/cm$^2$
0.1 mg/cm$^2$
0.04 mg/cm$^2$
0.008 mg/cm$^2$

EXAMPLES 3–8

The adhesion of photopolymerizable composition D to primed and unprimed substrate was measured. Separate photosensitive plates were prepared as described in Example 1 except that no primer was employed on one substrate while various coating weights of primer composition IB were employed on the other substrates. The bare surface of the photopolymerizable layer was covered with a sheet identical to the substrate described in Example 1 with the second polyester layer contacting the photopolymerizable composition. The samples were irradiated overall with 5.7 mw/cm$^2$ ultraviolet light for 5 minutes on the top and bottom. A General Electric G8T5 black lamp was used for the irradiation. The samples were then cut into strips 2.5 cm × 15 cm and measured for 90° and 180° adhesion. The results of the tests are given in Table 2.

TABLE 2

| | EXAMPLES | | | | | |
|---|---|---|---|---|---|---|
| | 3 | 4 | 5 | 6 | 7 | 8 |
| Primer dried coating weight (mg/cm$^2$) | 0.3 | 0.15 | 0.1 | 0.04 | 0.008 | None |
| Adhesion (g/cm width) | | | | | | |
| 90° | 454 | 200 | 200 | 73 | 18 | <15 |
| 180° | 1400 | 1140 | 855 | 182 | 54 | <15 |

EXAMPLES 9–16

The adhesion of photopolymerizable composition F to primed and unprimed substrates was measured. Separate photosensitive plates were prepared as described in Example 1 except that no primer was employed on the base of Example 20, while various coating weights of primer composition II were employed on the bases of Examples 10–14 and various coating weights of primer composition IB were employed on the bases of Examples 15–16. The base surface of the photopolymerizable layer was covered with a sheet identical to the substrate described in Example 1 with the second polyester layer contacting the photopolymerizable composition. The samples were irradiated overall with 5.7 mw/cm$^2$ ultraviolet light for 5 minutes on the top and bottom. A General Electric G8T5 black lamp was used for the irradiation. The samples were then cut into strips 2.5 cm × 15 cm and measured for 90° and 180° adhesion. The results of the test are given in Table 3.

TABLE 3

| | EXAMPLES | | | | | | | |
|---|---|---|---|---|---|---|---|---|
| | 9 | 10 | 11 | 12 | 13 | 14 | 15 | 16 |
| Primer Dried coating weight (mg/cm$^2$) | 0.3 | 0.15 | .077 | .04 | .008 | 0.1 | 0.2 | None |
| Adhesion (gm/cm width) | | | | | | | | |
| 90° | 327 | 364 | 290 | 310 | 127 | 310 | 310 | 18 |
| 180° | 635 | 690 | 418 | 545 | 200 | 526 | 545 | 36 |

What is claimed is:
1. A composite sheet material comprising:
(i) a dimensionally stable substrate;
(ii) a water-insoluble, organic, polymeric coating on at least one surface of said substrate, said coating consisting essentially of
(a) from about 10 to 100 mole percent of blocks of units of the formula

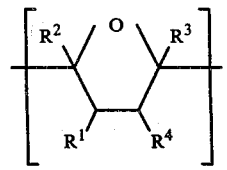

(b) from about 0 to 90 mole percent of blocks of units of the formula

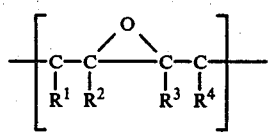

and (c) from about 0 to 75 mole percent of blocks of units of the formula

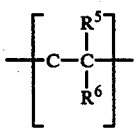

wherein $R^1$, $R^2$, $R^3$ and $R^4$ are individually hydrogen or alkyl groups containing up to 8 carbon atoms each, $R^5$ is hydrogen or methyl and $R^6$ is phenyl, cyano or —COOCH$_3$; and (iii) a layer of a photopolymerizable composition comprising a free-radical initiated, addition polymerizable compound and a photopolymerization initiator.

2. A composite structure in accordance with claim 1 wherein said substrate comprises an organic polymeric material.

3. A composite structure in accordance with claim 2 wherein said organic polymeric material is selected from saturated polyester, polyolefin, polycarbonate, polyamide, polyvinylchloride, polyvinylidene chloride, polyacrylate and cellulose ester films.

4. A composite structure in accordance with claim 3 wherein said organic polymeric material is saturated polyester.

5. A composite structure in accordance with claim 4 wherein said polyester comprises a biaxially oriented and heat-set coextruded film consisting essentially of (A) a first layer of a crystalline polyester selected from the group consisting of polyethylene terephthalate, polycyclohexane dimethyl terephthalate and polyethylene naphthalate and (B) a second layer of a polyester having a minor degree of crystallinity between about 20° C. and 230° C. and melting at a temperature less than about 230° C. wherein said second layer has a thickness from about one-fourth of the total thickness of said first layer to about 0.25 millimeter thick and comprises the condensation reaction product of (i) a dicarboxylic acid component consisting of from about 10 to about 100 mole percent of a dicarboxylic acid selected from the group consisting of isophthalic acid, hexahydroterephthalic acid, sebaic acid, succinic acid, adipic acid, azelaic acid, suberic acid, pimelic acid, glutaric acid or mixtures thereof, or the diesters of such acids and correspondingly from 90 to zero mole percent of terephthalic acid, and (ii) a glycol component, in substantially equimolar proportions with the dicarboxylic acid component, wherein the glycol component is selected from the group consisting of neopentyl glycol, 1,4-cyclohexane dimethanol, bisphenol A, and polymethylene glycol of the formula HO(CH$_2$)$_n$OH, wherein n is an integer of 2–10.

6. A composite structure in accordance with claim 1 wherein said water-insoluble coating consists essentially of from about 10 to 100 mole percent of blocks of (a) units and from about 0 to 90 mole percent of blocks of (b) units.

7. A composite structure in accordance with claim 6 wherein said $R^1$, $R^2$, $R^3$ and $R^4$ are each hydrogen.

8. A composite structure comprising:

(a) a substrate of a biaxially oriented and heat-set coextruded film consisting essentially of (A) a first layer of polyethylene terethalate and (B) second layer comprising the condensation reaction product of (i) 80 mole percent isophthalic acid and 20 mole percent terephthalic acid and (ii) a substantially equimolar quantity of said acids of polyethylene glycol, wherein said second layer has a thickness of from about one-fourth of the total thickness of said support layer to about 0.025 millimeter thick, a minor degree of crystallinity between about 20° C. and 230° C. and melting at a temperature less than about 230° C.;

(b) a water-insoluble, organic, polymeric coating on at least one surface of said substrate, said coating consisting essentially of (A) from about 25 to 100 mole percent of blocks of units of the formula

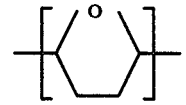

and (B) from about 0 to 75 mole percent of blocks of units of the formula

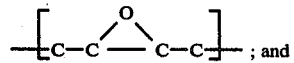 ; and and (c) a layer of a photopolymerizable composition comprising a free-radical initiated, addition polymerizable compound and a photopolymerization initiator.

* * * * *

UNITED STATES PATENT AND TRADEMARK OFFICE
CERTIFICATE OF CORRECTION

PATENT NO. : 4,141,736
DATED : February 27, 1979
INVENTOR(S) : George Canty

It is certified that error appears in the above-identified patent and that said Letters Patent are hereby corrected as shown below:

Col. 3, line 45, "coextended" should read -- coextruded --.

Col. 3, lines 56-57, "naph-thalate" should read

-- naphthalene --.

Signed and Sealed this

Tenth Day of July 1979

[SEAL]

Attest:

LUTRELLE F. PARKER
*Attesting Officer*   *Acting Commissioner of Patents and Trademarks*